United States Patent [19]

Fork

[11] Patent Number: 5,323,023

[45] Date of Patent: Jun. 21, 1994

[54] EPITAXIAL MAGNESIUM OXIDE AS A BUFFER LAYER ON (111) TETRAHEDRAL SEMICONDUCTORS

[75] Inventor: David K. Fork, Palo Alto, Calif.

[73] Assignee: Xerox Corporation, Stamford, Conn.

[21] Appl. No.: 985,086

[22] Filed: Dec. 2, 1992

[51] Int. Cl.$^5$ .................. H01L 39/22; H01B 12/00
[52] U.S. Cl. ............................. 505/235; 505/701; 505/703; 505/873; 505/191; 257/78; 257/613; 257/77; 427/62
[58] Field of Search ................ 257/77, 78, 613; 427/62; 505/1, 701, 703, 873

[56] References Cited

U.S. PATENT DOCUMENTS

| | | | |
|---|---|---|---|
| 4,980,339 | 12/1990 | Setsune et al. | 505/1 |
| 4,994,433 | 2/1991 | Chiang | 505/1 |
| 4,996,187 | 2/1991 | Chai | 505/1 |
| 5,032,568 | 7/1991 | Lau et al. | 505/1 |
| 5,039,657 | 8/1991 | Goldman et al. | 505/1 |
| 5,179,070 | 1/1993 | Harada et al. | 257/35 |

FOREIGN PATENT DOCUMENTS

| | | | |
|---|---|---|---|
| 0304078 | 2/1989 | European Pat. Off. | 257/33 |
| 1280375 | 10/1989 | Japan . | |

OTHER PUBLICATIONS

Japan Kokai Abstracts, all from vol. 14, No. 55 (E-882) Jan. 31, 1990 Keizo et al.; (Sumitomo); 0280369, 0280370, 0280371, 0280372, 0280373, 0280374, 0280376, 0280377, 0280378, 0280379, 0280380, and 0280382.

Norton et al., *Observation of the Early Stages of Heteroepitactic Growth of BaTiO$_3$ Thin-Films*, J. Mater. Res., vol. 5, No. 12, p 2762 (1990).

Buhay et al., *Pulsed Laser Deposition and Ferroelectric Characterization of Bismuth Titanate Films*, Appl. Phys. Lett., vol. 58, No. 14, p. 1470 (1991).

Ameen et al., *Processing and Structural Characterization of Ferroelectric Thin Films Deposited By Ion Beam Sputtering*, Mat. Res. Soc. Symp. Proc., vol. 200, p. 65 (1990).

Ramesh et al., *Epitaxy of Y-Ba-Cu-O Thin Films Grown On Single Crystal MgO*, Appl. Phys. Lett., vol. 56, No. 22, p. 2243 (1990).

Ramesh et al., *Epitaxial Growth of Ferroelectric Bismuth Titanate Thin Films By Pulsed Laser Deposition*, Appl. Phys. Lett., vol. 57, No. 15, p. 1505 (1990).

Horwitz et al., *In Situ Deposition of Epitaxial PbZr$_x$Ti$_{(1-x)}$O$_3$ Thin Films By Pulsed Laser Deposition*, Appl. Phys. Lett. vol. 59, No. 13, p. 1565 (1991).

Roas et al., *Epitaxial Growth of YBa$_2$Cu$_3$O$_{7-x}$ Thin Films By a Laser Evaporation Process*, Appl. Phys. Lett., vol. 53, No. 16, p. 1557 (1988).

de Keijser et al., *Epitaxial PbTiO$_3$ Thin Films Grown By Organometallic Chemical Vapor Deposition*, Appl. Phys. Lett., vol. 58, No. 23, p. 2636 (1991).

Ishida et al., *Epitaxial Growth of Ferroelectric PLZT[(Pb,La)(Zr,Ti)O$_3$] Thin Films*, J. Cryst. Growth, vol. 45, p. 393 (1978).

Lee et al., *Epitaxial Grown Sputtered LaAlO$_3$ Films*, Appl. Phys. Lett., vol. 57, No. 19, p. 2019 (1990).

(List continued on next page.)

Primary Examiner—William Mintel
Assistant Examiner—Alexander Oscar Williams
Attorney, Agent, or Firm—John M. Kelly

[57] ABSTRACT

An article of manufacture having an epitaxial (111) magnesium oxide (MgO) layer, suitable for use as a buffer layer, on a (111) surface of a tetrahedral semiconductor substrate, and method for its manufacture is described. The article may further include an epitaxial oxide overlayer on the (111) MgO layer. The overlayer may be a conducting, superconducting, and/or ferroelectric oxide layer. The method of producing the epitaxial (111) magnesium oxide (MgO) layer on the (111) surface of a tetrahedral semiconductor substrate proceeds at low temperature. The method may further include steps for forming the epitaxial oxide layer on the (111) MgO layer. The methods include the steps of preparing the (111) surface of a tetrahedral semiconductor substrate for deposition and the low temperature depositing of an MgO layer on the prepared surface. Further steps may include the depositing of the oxide layer over the MgO layer.

31 Claims, 1 Drawing Sheet

OTHER PUBLICATIONS

Char et al., *Properties of Epitaxial $YBa_2Cu_3O_7$ Thin Films On $Al_2O_3\{1012\}$*, Appl. Phys. Lett. vol. 58, No. 8, p. 785 (1990).

Masumoto et al., *Preparation of $Bi_4Ti_3O_{12}$ Films On A Single-Crystal Sapphire Substrate With Electron Cyclotron Resonance Plasma Sputtering*, Appl. Phys. Lett., vol. 58, No. 3, p. 243 (1991).

Adachi et al., *Dielectric Properties of PLZT Epitaxial Thim Films*, Jap. J. Appl. Phys., vol. 22, supplement 22-2, p. 11 (1983).

Kidoh et al., *Ferroelectric Properties of Lead-Zirconate-Titanate Films Prepared By Laser Ablation*, Appl. Phys. Lett., vol. 58, No. 25, p. 2910 (1991).

Sandstrom et al., *Lanthanum Gallate Substrates For Epitaxial High-Temperature Superconducting Thin Films*, Appl. Phys. Lett., vol. 53, No. 19, p. 1874 (1988).

Li et al., *Growth of YBaCuO Thin Films On Random and (100)Aligned $ZrO_2$ Substrates*, Appl. Phys. Lett., vol. 55, No. 17, p. 1792 (1989).

Ramesh et al., *Ferroelectric Bismuth Titanate/Superconductor (Y-Ba-Cu-O) Thin Film Heterostructures On Silicon*, Appl. Phys. Lett., vol. 59, No. 14, p. 1782 (1991).

Wu et al., *High Critical Currents in Epitaxial $YBa_2Cu_3O_{7-x}$ Thin Films On Silicon With Buffer Layers*, Appl. Phys. Lett., vol. 54, No. 8, p. 754 (1989).

K. Mizuno et al., *Low Temperature Deposition of Y-Ba-Cu-O Films On A $CaF_2$/GaAs Substrate*, Appl. Phys. Lett., vol. 4, pp. 383-385 (1989).

Masayoshi Tonouchi et al., *Epitaxial Growth of NbN On An Ultrathin MgO/Semiconductor System*, Appl. Phys. Lett., vol. 62, No. 3, pp. 961-966 (1987).

Kellet et al., *Superconducting $YBa_2Cu_3O_{7-\delta}$ Thin Films On GaAs With Conducting Indium-Tin-Oxide Buffer Layers*, Appl. Phys. Lett., vol. 57, No. 24, pp. 2588-2590 (1990).

Jia et al., *Role Of Buffer Layers For Superconducting $YBa_2Cu_3O_{7-x}$ Thin Films On GaAs Substrates*, Appl. Phys. Lett., vol. 59, No. 9, pp. 1120-1122 (1991).

Witanachchi et al., *As-Deposited Y-Ba-Cu-O Superconducting Films On Silicon At 400° C.*, Appl. Phys. Lett., vol. 54, No. 6, pp. 578-580 (1989).

Fork, D. K.; Ponce, F. A.; Tramontana, J. C.; Geballe, T. H. Epitaxial MgO On Si(001) For Y-Ba-Cu-O Thin-Film Growth By Pulsed Laser Deposition. Applied Physics Letters. vol. 58, No. 20, 20 May 1991, New York, U.S.A. pp. 2294-2296.

Terashima, T.; Bando, Y.; Lijima, K.; Yamamoto, K.; Hirata, K. Epitaxial Growth of $YBa_2Cu_3O_{7-x}$ Thin Films On (110) $SrTiO_3$ Single Crystals By Activated Reactive Evaporation. Applied Physics Letters. vol. 53, No. 22, 28 Nov. 1988, New York, U.S.A. pp. 2232-2234.

EPITAXIAL MAGNESIUM OXIDE AS A BUFFER LAYER ON (111) TETRAHEDRAL SEMICONDUCTORS

The present invention relates to the forming and use of epitaxial buffer layers on (111) tetrahedral semiconductors.

Background of the Invention

The epitaxial growth of oxide layers on substrates is of great interest to the research community. As used herein a substrate is any layer upon which an oxide layer or any type of film is formed. Epitaxy refers to the alignment of crystalline structures. It is important to note that an epitaxial oxide layer grown on a crystalline substrate may be of a different material and/or may have a different crystalline structure than that of the substrate.

An important class of substrates is that of semiconductor materials. As is well known, semiconductor substrates enable the fabrication of many types of devices, such as transistors, capacitors, resistors, and diodes. The large class of semiconductor substrates includes a smaller subclass of the tetrahedral semiconductors. A tetrahedral semiconductor is a semiconductor in which each non-surface atom is surrounded by four tetrahedrally arranged nearest neighbors. Important tetrahedral semiconductors include diamond, silicon, germanium, gallium arsenide (GaAs), and silicon carbon (SiC). As is also well known, the elemental tetrahedral semiconductors are covalently bonded together while the compound tetrahedral semiconductors are covalently and ionically bonded.

Various researchers have investigated processes of forming epitaxial oxide layers on semiconductor substrates. A motivation for such research is that some epitaxial oxide layers support the phenomenons of superconductivity or ferroelectricity. Superconductivity relates to the absence of resistance and permeability. Ferroelectricity relates to the existence of a permanent electric dipole moment which can be controlled by an external electric field.

Ferroelectric oxide layers are being investigated for their use in such things as lasers, nonvolatile memories, optical waveguides, optical frequency doublers, optical modulators, and surface acoustic wave devices. The epitaxial growth of ferroelectric oxide layers is important since the properties of ferroelectric materials depend on their crystallographic orientation. For example, in nonvolatile memories the orientation of the ferroelectric dipole moment can store information. Epitaxy enhances the dipole moment of a region because substantially all of the dipoles in a region can readily be made to align in the same direction.

The production of epitaxial oxide layers on semiconductor substrates may enable the integration of semiconductor devices with the properties of the epitaxial oxide layer. For example, an epitaxial oxide layer could be an optical waveguide for light output from a laser fabricated on a semiconductor substrate. Another example would be the use of the epitaxial oxide layer to modulate the light output from such a laser.

Even if epitaxy is not required for a given application, eqitaxy can be beneficial. For example, it is well known that ferroelectric crystals change shape when an electric field is applied. This change can produce internal stresses which limit the lifetime of the device. By growing a ferroelectric oxide layer epitaxially, and by applying the electric field normal to the surface, the internal stress can be reduced or eliminated since the crystal distortion can be made to occur normal to the surface of the layer.

However, the forming of epitaxial oxide layers on semiconductor substrates is not easy. Each oxide differs from the other oxides in a number of properties such as crystal structure, heat of formation, lattice constants, melting temperature, and thermal expansion constants. Thus, each oxide requires its own process to form epitaxially on a given substrate. Additionally, the environmental conditions required to grow a particular epitaxial layer may be so harsh that the desired underlying substrate is damaged. For example, epitaxial zirconia is typically formed at about 800° C., while epitaxial spinel is typically formed at 980° C. However, GaAs, a desirable substrate in many applications, begins to lose arsenic around 400° C. By the time an epitaxial layer is formed, the substrate may be ruined.

One approach to producing a desired epitaxial oxide layer on a particular substrate without damaging the substrate is to use a buffer layer. A buffer layer is a layer, usually thin, interposed between the substrate and the desired epitaxial oxide layer. Since the buffer layer itself may be, and in the present invention is, an epitaxial oxide layer, the buffer layer is hereinafter referred to simply as the buffer layer while the desired epitaxial oxide layer is referred to as the overlayer.

A good buffer layer must have several properties. It must join the substrate to the overlayer without damage to either. It should transfer the crystalline orientation of the substrate to the overlayer so the overlayer forms epitaxially. Finally, the buffer layer must be a good diffusion barrier, i.e., it must prevent excessive diffusion of atoms between the substrate and the overlayer.

Various materials have been used as buffer layers in the prior art. Such buffer layers include the oxides of cubic zirconia, pure zirconia, and spinel. Each of these oxides are significantly different and, as previously indicated, require their own special fabrication process to form a buffer layer on a given substrate. Indeed, it generally has been accepted that whether a particular buffer layer is useful with a given substrate in a particular application must be settled experimentally.

An oxide of special interest to the present invention is magnesium oxide (MgO). MgO is a large band gap insulator having an NaCl structure and an index of refraction of 1.7 (which is smaller than most oxide ferroelectrics and is suitable for making optical transmission lines). MgO's lattice constant is 4.213 Å, implying a large lattice mismatch to most semiconductors (including Si, Ge, and GaAs). Large lattice mismatches have generally been thought to work against epitaxial growth of a buffer layer. However, copending U.S. patent application Ser. No. 07/798,672, which is hereby incorporated by reference, teaches that lattice constant mismatches do not have a large impact on the epitaxial growth of MgO buffer layers on tetrahedral semiconductor substrates. Furthermore, that application indicates that MgO, which is highly ionic, will grow epitaxially both on purely covalent tetrahedral semiconductors, and on partially ionic tetrahedral semiconductors.

Single crystal MgO has been successfully used as a substrate for a variety of oxide layers, including YBCO (see M. Grant Norton et al. Appl. Phys. Lett. 55, 2348 (1989)), PZT (see J. S. Horwitz et al. Appl. Phys. Lett. 59, 1565 (1991)) and LiNbO₃ (see H. Matsunaga et al., J.

Crystal Growth 99, 630 (1990)). However, no technique of forming MgO buffer layers on semiconductor substrates are known to be in the public prior art.

However, the copending U.S. patent application Ser. No. 07/798,672 does teach the use of (100) MgO as a buffer layer on (100) tetrahedral semiconductors. The (100) surface of MgO has the lowest surface energy, and thus represents the "best" surface on which to conduct epitaxial growth experiments. By contrast, the (111) surface of MgO is unstable due to its surface dipole and, therefore, is expected to have a high surface energy. To minimize energy, one expects the (111) surface of MgO to restructure itself during formation, possibly making epitaxy difficult or impossible.

An important difference between MgO buffer layers and those known in the prior art is that MgO can be epitaxially grown on tetrahedral semiconductor substrates at the relatively low temperatures of about 300° to 400° C. Such low temperature growth significantly reduces the danger of substrate damage.

While (100) MgO epitaxial buffer layers are useful, (111) MgO epitaxial buffer layers on (111) tetrahedral semiconductors surfaces would enable various orientationally constrained epitaxial structures. For example, lithium niobate could be grown on GaAs such that the ferroelectric axis of the lithium niobate is normal to that of the substrate. Since lithium niobate has trigonal symmetry, the planes normal to its ferroelectric axis have triangular symmetry, as does the (111) surface of any cubic crystal (such as GaAs). Although many factors influence whether epitaxy is possible, symmetry matching of the mating surfaces is a basic requirement. Possible devices based on this epitaxial lithium niobate/epitaxial (111) MgO buffer layer/(111) GaAs structure include optical modulators and frequency doublers monolithically integrated with a GaAs-based semiconductor laser.

(111) oriented MgO films have been previously reported on Si substrates by Huang and Kitai (Appl. Phys. Lett. 61, 1450 (1992) via atomic layer growth at 600 C. Huang and Kitai report that the (111) orientation stems from the fact that along a [111] direction, the atomic layers are alternatively strictly Mg and strictly O. Therefore, by alternately depositing monolayer fluxes of Mg and O, the (111) orientation develops (provided that the temperature is not high enough to cause layer intermixing).

The formation of epitaxial layers of various ferroelectric and/or superconductive materials on silicon substrates also have been demonstrated. See, e.g., copending U.S. patent application Ser. No. 07/621,325, entitled "Superconducting Thin Films on Epitaxial Magnesium Oxide Grown on Silicon," and copending U.S. patent application Ser. No. 07/667,669, entitled "Silicon Substrate Having An Epitaxial Superconducting Layer Thereon and Method of Making Same," and Ramesh et al., "Ferroelectric Bismuth Titanate/Superconductor (Y-Ba-Cu-O) Thin-Film Heterostructures on Silicon", Appl. Phys. Lett. vol. 59, no. 14, p. 1782 (1991). Epitaxial ferroelectric and high temperature superconducting oxide films on other substrates also have been reported. For example, PLZT thin films on GaAs and GaP have been demonstrated by Ishida et al. in "Epitaxial Growth of Ferroelectric PLZT [(Pb, La)(Zr, Ti)O$_3$] Thin Films", J. Cryst. Growth, vol. 45, p. 393 (1978).

It would be advantageous to have a low temperature method of forming (111) MgO buffer layers on (111) tetrahedral semiconductor substrates. Further, it would be useful to have a method of forming epitaxial oxide layers on such a buffer layer. Additionally, structures comprised of an epitaxial oxide layer on an epitaxial (111) MgO buffer layer on a (111) tetrahedral semiconductor substrate also would be useful.

SUMMARY OF THE INVENTION

The present invention relates to articles of manufacture having an epitaxial (111) magnesium oxide (MgO) buffer layer on a (111) surface of a tetrahedral semiconductor substrate. Those articles of manufacture may further include an epitaxial oxide overlayer on the (111) MgO buffer layer. Such overlayers may be conducting, superconducting, and/or ferroelectric.

The present invention further relates to low temperature methods of producing an epitaxial (111) magnesium oxide (MgO) buffer layer on a (111) surface of a tetrahedral semiconductor substrate. Those methods may further include steps for forming an epitaxial oxide layer on the (111) MgO buffer layer. The methods include the steps of preparing the (111) surface of a tetrahedral semiconductor substrate for deposition and the low temperature depositing of an MgO layer on the prepared surface. Further steps may include the depositing of an oxide layer over the MgO layer.

The scope of the present invention will become more apparent from the following detailed description when taken in conjunction with these drawings.

DETAILED DESCRIPTION

Magnesium oxide (MgO) itself is neither ferroelectric nor superconducting. However, it is a suitable substrate for the epitaxial growth of materials which have such properties. In the present invention a (111) epitaxial layer of MgO is formed on a (111) surface of a tetrahedral semiconductor substrate. The (111) MgO layer then may be used as a buffer layer to produce an epitaxial oxide overlayer. In the development of this invention (and as taught below) it has been established that MgO (111) grows epitaxially on (111) tetrahedral semiconductors, such as (111) GaAs, at relatively low temperatures. It has further been established that MgO (111) is a suitable diffusion barrier. Once a (111) MgO layer is formed, the tetrahedral semiconductor substrate may be capped. Then, if any overlayer that is added requires higher formation temperatures, the substrate is protected from damage.

Figure 1:
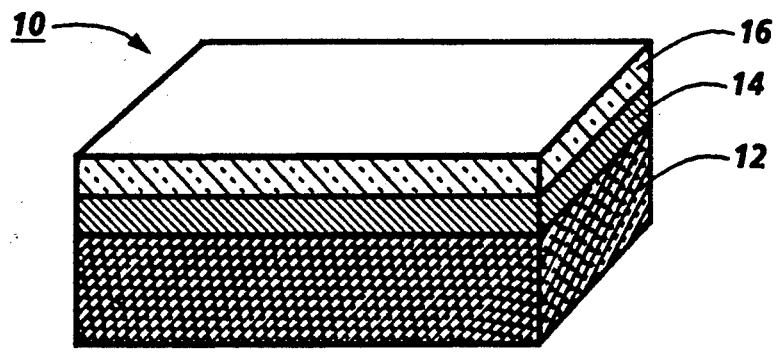
FIG. 1 shows a structure according to the principles of the present invention.

FIG. 1 shows a structure 10 according to the present invention. It is to be noted that FIG. 1 is not to scale. In particular, the thicknesses of the various layers are exaggerated. The structure 10 is comprised of a substrate 12 of (111) Si doped GaAs on which an epitaxial layer 14 of (111) MgO is formed. On the epitaxial layer 14 is a film 16 of epitaxial LiNbO$_3$. The epitaxial layer 14 and the film 16 are grown via diffusion on the substrate using the method discussed below. Experiments show that the epitaxial layer 14 and the film 16 grow smoothly.

Figure 2:
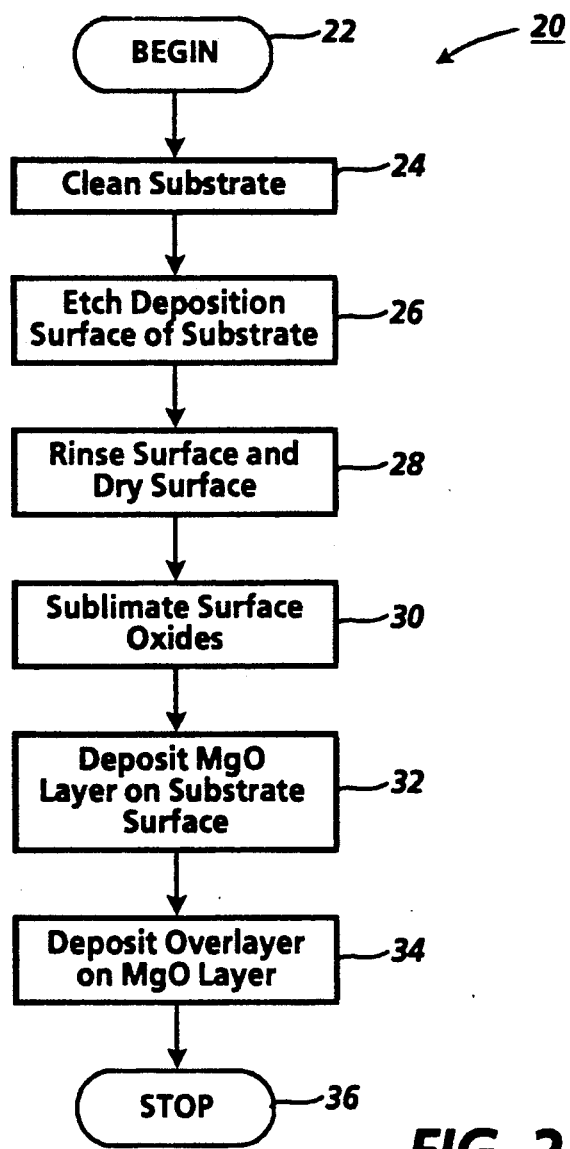
FIG. 2 is a flow chart of a method for producing the structure in FIG. 1.

A method 20 for producing the structure 10 is illustrated in FIG. 2. The method 20 begins, step 22, with the cleaning of the substrate 12, step 24. One way to do this is to wash the substrate with one or more of the commonly used solvents for Si doped GaAs. After cleaning, the (111) surface of the substrate 12 on which MgO is to be deposited is prepared for deposition by etching with $H_2SO_4:H_2O_2:H_2O$, step 26. The substrate 12 is then rinsed with deionized water and ethanol, and spin-dried with ethanol in a flowing $N_2$ hood, step 28. The substrate 12 is then immediately introduced into the deposition chamber. To sublimate the surface oxides, the substrate is heated at 680° C. (600° C. by the pyrometer, see below) for 2 minutes at a base pressure of $3 \times 10^{-7}$ Torr, step 30. This temperature is based on the assumption that oxide desorption occurs at 582° C.

Steps 24 through 30 are suitable for preparing GaAs substrates for MgO deposition. If a substrate of another material is used, the surfaces of that material should also be prepared for MgO deposition. The prior art literature may be consulted for suitable surface preparation procedures.

After preparation of the surface of the substrate 12, MgO is grown via deposition on the prepared surface, step 32. It has been shown that (111) MgO will grow on the (111) surface of the substrate. Temperatures in the range of about 300° C. to 400° C., and pressures of about $5 \times 10^{-6}$ Torr $O_2$ are suitable for growing the epitaxial layer 14 of (111) MgO. Specific details of one deposition process are given below. After formation of the epitaxial layer 14, the film 16 of $LiNbO_3$ is grown, also via deposition, on the (111) surface of the substrate/MgO structure, step 34. Again, specific details are given below. Temperatures in the range of 500° to 700° C., and pressures of about 1 to $200 \times 10^{-3}$ Torr $O_2$ are suitable for growing the film 16. After deposition of the film 16, the structure 10 is complete and the method 20 ends, step 36.

The method 20 is suitable for producing the structure 10. If a structure without an overlayer is desired, step 34 of method 20 may be omitted.

The depositions of the MgO layer 14 and the $LiNbO_3$ film 16 are carried out using pulsed laser ablation with a 308 nm XeCl excimer laser. A pulse rate of 4 Hz, a pulse length of 17 ns, and a laser energy of 130 mJ, which gives an energy density of 1.3 J/cm$^2$, are applied to Mg and $LiNbO_3$ targets. The target-to-substrate distance is set to about 50 mm. An Mg metal target is used instead of an MgO target since light absorption of MgO at 308 nm is too weak to ablate the oxide. Mg from the Mg metal target is readily oxidized by $O_2$ due to the MgO molecule's high binding energy (greater than 10 eV).

During deposition the substrate 12 should be heated by quartz lamp radiation. The deposition temperatures given were measured with a thermocouple near the lamp (which is hotter than the substrate) and by a pyrometer that faced the substrate.

The structure 10 has been subjected to extensive testing, the results of which may be useful for others who seek to practice the present invention. The following results are not meant to define, limit, or restrict the present invention. Rather they are meant to assist others.

X-ray $\theta$-$2\theta$ diffraction patterns from the $LiNbO_3$/MgO/GaAs structure 10 shows that the MgO and $LiNbO_3$ layers grow epitaxially. The $LiNbO_3$ [001] direction orientates parallel to the MgO [111] direction, which in turn orientates parallel to the GaAs [111] direction. The in-plane relationship of MgO to GaAs is MgO [1$\bar{1}$0] parallel to GaAs [1$\bar{1}$0]. The $LiNbO_3$ [1$\bar{1}$00][$\bar{1}$100] directions are parallel to the GaAs [1$\bar{1}$0].

Although this indicates two grain orientations in the $LiNbO_3$ film 16, they do not mix unequal components of tensor properties. The degree of in-plane and out-of-plane misalignment of the epitaxial layer 14 and the film 16 with respect to the substrate was measured using x-ray diffraction. Out-of-plane misalignment of the MgO layer was found to be typically about one degree. Out-of-plane misalignment of the $LiNbO_3$ film 16 was found to be typically about 1.2 degrees. The in-plane film misalignments were found to generally be less than 5 degrees.

Cross sections of the interfaces between the $LiNbO_3$, MgO and GaAs materials were examined using transmission electron microscopy. The interfaces were found to be abrupt, an indication of no signs of interdiffusion or reaction. Furthermore, the layers are flat, indicating the absence of faceting, or gross surface roughness.

The refractive index of the MgO film was measured by ellipsometry. Values very close to the bulk value in films were obtained with the highest epitaxial quality (index of 1.710 compared to a bulk value of 1.735).

Epitaxial MgO (111) buffer layers have now been grown on GaAs (111). Since epitaxial MgO (111) can be produced on GaAs (111) at low temperatures, despite the large difference in lattice constants between MgO and GaAs, it is concluded that epitaxial MgO (111) will grow at low temperatures on all (111) tetrahedral semiconductors. The lattice mismatch of MgO and GaAs is so large (25), that it provides strong evidence that lattice matching is not important for the epitaxial growth. Thus, the extension of the MgO epitaxial growth method to (111) oriented compound tetrahedral semiconductor substrates (such as ZnSe and InP), and to (111) oriented column IV tetrahedral semiconductors (such as Ge, Si, and diamond) is made with predictable results.

Further, using a method similar to method 20, $ABO_3$ type perovskite thin films, such as $PbTiO_3$, $(PbLa)TiO_3$ [PLT], $Pb(ZrTi)O_3$ [PZT], $(Pb,La)(Zr,Ti)O_3$ [PLZT], $SrTiO_3$, $KNbO_3$, $KTaO_3$, $NaNbO_3$, $CaTiO_3$, $LaAlO_3$, and $NaTaO_3$, can be grown epitaxially on Ge, diamond, cubic SiC, AlAs, AlSb, AlP, GaP, GaSb, InP, InAs, InSb, ZnS, ZnSe, ZnTe, CaSe, CdTe, HgSe, HgTe, CdS, AlGaP, AlInP, AlGaAs, AlInAs, AlAsSb, GaInAs, GaInSb, GaAsSb, and InAsSb substrates using low temperature grown epitaxial (111) MgO buffer layers. The low temperature method of growing epitaxial MgO prevents damage to the tetrahedral compound semiconductors. Finally, any material which grows epitaxially on single crystal (111) MgO substrate can be grown on an epitaxial (111) MgO buffer layer over a tetrahedral semiconductor substrate.

Those skilled in the art to which this invention relates will recognize that many changes in the described structure 10 and the method 20 are possible without departing from their spirit and scope. For example, the method 20 is described as using pulsed laser deposition. Such deposition is only one of many suitable growth techniques. Others, such as sputtering, electron beam deposition, molecular beam deposition, ion plating, and chemical vapor deposition may also be used. Thus, the disclosures and descriptions herein are to be viewed as illustrative only and not in any sense limiting.

What is claimed is:

1. A structure comprising:
   a (111) oriented tetrahedral compound semiconductor substrate; and a layer of epitaxial (111) magnesium oxide on said substrate.

2. The structure of claim 1, wherein said substrate is a compound of at least one element from column III and at least one element from column V of the periodic table.

3. The structure of claim 2 wherein said substrate is selected from the group consisting of AlAs, AlSb, AlP, GaAs, GaP, GaSb, InP, InAs, InSb, AlGaP, AlInP, AlGaAs, AlInAs, AlAsSb, GaInAs, GaInSb, GaAsSb, and InAsSb.

4. The structure of claim 1, wherein said substrate is cubic SiC.

5. The structure of claim 1, wherein said substrate is a compound of at least one element selected from column II and at least one element selected from column VI of the periodic table.

6. The structure of claim 5 wherein said substrate is selected from the group consisting of ZnS, ZnSe, ZnTe, CdSe, CdTe, HgSe, HgTe, and CdS.

7. The structure of claim 1, further including an oxide overlayer formed on said epitaxial layer of magnesium oxide.

8. The structure of claim 7, wherein the oxide overlayer is conducting or superconducting.

9. The structure of claim 7, wherein the material of said overlayer is epitaxial.

10. The structure of claim 9 wherein said overlayer is selected from the group consisting of $BaTiO_3$, $PbTiO_3$, $PbLaTiO_3$, $Pb(ZrTi)O_3$, $(Pb,La)(Zr,Ti)O_3$, $SrTiO_3$, $KNbO_3$, $KTaO_3$, $NaNbO_3$, $NaTaO_3$, $LiNbO_3$, $LiTaO_3$, $CaTiO_3$, $LaAlO_3$, $NaTaO_3$, and YBCO.

11. A structure comprising:
a GaAs (111) substrate;
a layer of epitaxial (111) magnesium oxide on said substrate; and
an epitaxial overlayer formed on said layer of epitaxial magnesium oxide.

12. The structure of claim 11, wherein said epitaxial overlayer is superconducting.

13. The structure of claim 12, wherein said epitaxial overlayer is YBCO.

14. The structure of claim 11, wherein said epitaxial overlayer is ferroelectric.

15. The structure of claim 14, wherein said epitaxial overlayer is selected from the group consisting of $LiNbO_3$, $LiTaO_3$, $BaTiO_3$, $PbTiO_3$, $PbLaTiO_3$, $Pb(ZrTi)O_3$, $(Pb,La)(Zr,Ti)O_3$, $SrTiO_3$, $KNbO_3$, $KTaO_3$, $NaNbO_3$, and $NaTaO_3$.

16. A structure comprising:
a Ge (111) substrate;
a layer of epitaxial (111) magnesium oxide on said substrate; and
an epitaxial overlayer formed on said layer of epitaxial magnesium oxide.

17. The structure of claim 16, wherein said epitaxial overlayer is superconducting.

18. The structure of claim 16, wherein said epitaxial overlayer is ferroelectric.

19. The structure of claim 18, wherein said epitaxial overlayer is selected from the group consisting of $LiNbO_3$, $LiTaO_3$, $BaTiO_3$, $PbTiO_3$, $PbLaTiO_3$, $Pb(ZrTi)O_3$, $(Pb,La)(Zr,Ti)O_3$, $SrTiO_3$, $KNbO_3$, $KTaO_3$, $NaNbO_3$, and $NaTaO_3$.

20. A structure comprising:
a diamond (111) substrate;
a layer of epitaxial (111) magnesium oxide on said substrate; and
an epitaxial overlayer formed on said layer of epitaxial magnesium oxide.

21. The structure of claim 20, wherein said epitaxial overlayer is superconducting.

22. The structure of claim 20, wherein said epitaxial overlayer is ferroelectric.

23. The structure of claim 22, wherein said epitaxial overlayer is selected from the group consisting of $LiNbO_3$, $LiTaO_3$, $BaTiO_3$, $PbTiO_3$, $PbLaTiO_3$, $Pb(ZrTi)O_3$, $(Pb,La)(Zr,Ti)O_3$, $SrTiO_3$, $KNbO_3$, $KTaO_3$, $NaNbO_3$, and $NaTaO_3$.

24. A structure comprising:
a (111) oriented tetrahedral compound semiconductor substrate; and
a layer of epitaxial (111) magnesium oxide on said substrate and having a crystallographic axis aligned with at least one of the crystallographic axes of said substrate.

25. The structure of claim 24, wherein said substrate is a compound of at least one element from column III and at least one element from column V of the periodic table.

26. The structure of claim 25 wherein said substrate is comprised of material selected from the group consisting of AlAs, AlSb, AlP, GaAs, GaP, GaSb, InP, InAs, InSb, AlGaP, AlInP, AlGaAs, AlInAs, AlAsSb, GaInAs, GaInSb, GaAsSb, and InAsSb.

27. The structure of claim 24, wherein said substrate in cubic SiC.

28. The structure of claim 24, wherein said substrate is a compound of at least one element selected from column II and at least one element selected from column VI of the periodic table.

29. The structure of claim 28 wherein said substrate is comprised of material selected from the group consisting of ZnS, ZnSe, ZnTe, CdSe, CdTe, HgSe, HgTe, and CdS.

30. The structure of claim 24, further including an oxide overlayer formed on said epitaxial (111) layer of magnesium oxide.

31. The structure of claim 30 wherein said overlayer is comprised of material selected from the group consisting of $BaTiO_3$, $PbTiO_3$, $PbLaTiO_3$, $Pb(ZrTi)O_3$, $(Pb,La)(Zr,Ti)O_3$, $SrTiO_3$, $KNbO_3$, $KTaO_3$, $NaNbO_3$, $NaTaO_3$, $LiNbO_3$, $LiTaO_3$, $CaTiO_3$, $LaAlO_3$, $NaTaO_3$, and YBCO.

* * * * *